(12) United States Patent
Giacomini et al.

(10) Patent No.: US 6,967,518 B2
(45) Date of Patent: Nov. 22, 2005

(54) HIGH VOLTAGE LEVEL SHIFTING IC WITH UNDER-GROUND VOLTAGE SWING WITHSTANDING CAPABILITY

(75) Inventors: Davide Giacomini, Valdengo (IT); Enrico Bianconi, Rivalta (IT)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/460,322

(22) Filed: Jun. 12, 2003

(65) Prior Publication Data

US 2003/0231046 A1 Dec. 18, 2003

Related U.S. Application Data

(60) Provisional application No. 60/388,583, filed on Jun. 12, 2002.

(51) Int. Cl.[7] ................................................. H03L 5/00
(52) U.S. Cl. .......................... 327/333; 326/80; 326/81
(58) Field of Search ..................... 327/108–112, 333; 326/62–81

(56) References Cited

U.S. PATENT DOCUMENTS 5,502,412 A    3/1996  Choi et al.
6,724,223 B2 * 4/2004  Ichiguchi et al. ............. 326/81

* cited by examiner

Primary Examiner—Kenneth B. Wells
(74) Attorney, Agent, or Firm—Ostrolenk, Faber, Gerb & Soffen, LLP

(57) ABSTRACT

A level shifting circuit provides a reference bias voltage to permit signal transfer between two circuits with different common voltage reference levels. The bias voltage is less than a common voltage reference level for either of the two connected circuits. By providing the bias voltage, the range of variation for the common voltage reference levels between the two circuits is increased when the reference voltages float with respect to each other. The level shifting circuits permit signals to be transferred from a low voltage to a high voltage circuit with increased reliability and noise immunity, and vice versa. The level shifting circuit is particularly useful for driving a half bridge switch configuration, and transmitting a floating current sense signal.

23 Claims, 8 Drawing Sheets

HIGH VOLTAGE LEVEL SHIFTING IC WITH UNDER-GROUND VOLTAGE SWING WITHSTANDING CAPABILITY

RELATED APPLICATION

The present application is based on and claims benefit of U.S. Provisional Application Ser. No. 60/388,583, filed Jun. 12, 2002, entitled HIGH VOLTAGE LEVEL SHIFTING IC WITH UNDER-GROUND VOLTAGE SWING WITHSTANDING CAPABILITY, to which a claim of priority is made.

FIELD OF THE INVENTION

This invention relates to a circuit for providing an under-ground voltage immune integrated circuit (IC) to be used in industrial applications where gate driver and current sensing devices are often subjected to latch up problems during the under-ground (or negative relative to ground) voltage swings.

BACKGROUND OF THE INVENTION

In many industrial applications it is necessary to translate a digital signal at TTL or CMOS level from the original ground reference to another reference that is normally floating between much higher voltage limits (0–600V or 0–1200V) with respect to the reference where the signal is generated. In other cases, a signal generated in the floating stages of the system needs to be translated to the stable ground of the remaining of the circuitry in order to be processed.

FIG. 1 and FIG. 2 show the solution implemented in a prior art integrated architecture. It is clearly evident that the signal transmission can be done only when the ground shift potential is positive, that is the floating ground voltage is above the logic ground and the $V_{DS}$ on the level shifter MOSFET is high enough to keep the device out of saturation. If the floating ground voltage approaches the logic ground voltage and the MOSFET enters the saturation region, no signal can be transmitted. When the floating ground goes below the logic ground, that is, the ground shift potential is negative, the transmission is not possible at all and even worse, if the positive side of the high side floating supply is below the logic ground level, then other serious problems, such as latch up and consequent fatal destruction may occur in the IC structure depending on its substrate ground connection.

Summing up, the structures shown in FIG. 1 and FIG. 2 normally transmit correct information only when the positive side of the high side floating supply is at a voltage level at least 4V higher than the logic ground while, on the other hand, the maximum level shift potential is limited to the $BV_{DSS}$ voltage of the high voltage MOSFET normally at 600V or 1200V.

The MOSFETs in the figures are the only components able to withstand 1200V. The high side referenced circuits are normally low voltage analog or logic circuits surrounded by a high voltage isolation structure created through the insertion of $P^+$ and Poly silicon rings.

SUMMARY OF THE INVENTION

A control or communications signal reference to a low voltage ground is translated for use with a high voltage, high power switching circuit. An input signal is referenced to a floating voltage bias level relative to the input circuit, and the level shifted to the desired voltage range. When used in a half bridge configuration, the translated and level shifted signal is further translated to another high power switching stage that has an additional floating voltage reference. The signals provided for control of the switching circuit are codified into pulses, the duty cycle of which provides the control to the switching circuit.

In accordance with the present invention, there is provided an integrated circuit with isolation rings to maintain a particular isolation level. For example, the first translation and level shifting stage includes an isolation ring that is capable of withstanding a substrate biasing voltage. The second translation and level shifting stage includes isolation rings to withstand high voltage levels to prevent interference between the first stage or the substrate biasing voltage.

The present invention permits a signal to be transferred from a low voltage circuit to a high voltage circuit, and vice-versa. Accordingly, the invention may be used to control a high power circuit with low power logic, such as in the case of the control for a half bridge power switching arrangement. Moreover, the invention can be used to read a low power signal with higher power logic, such as in the case of a current sense circuit.

BRIEF DESCRIPTION OF THE DRAWINGS

The present invention is described in greater detail below, with reference to the accompanying drawings, in which.

DETAILED DESCRIPTION OF THE PREFERRED EMBODIMENTS

Figure 1:
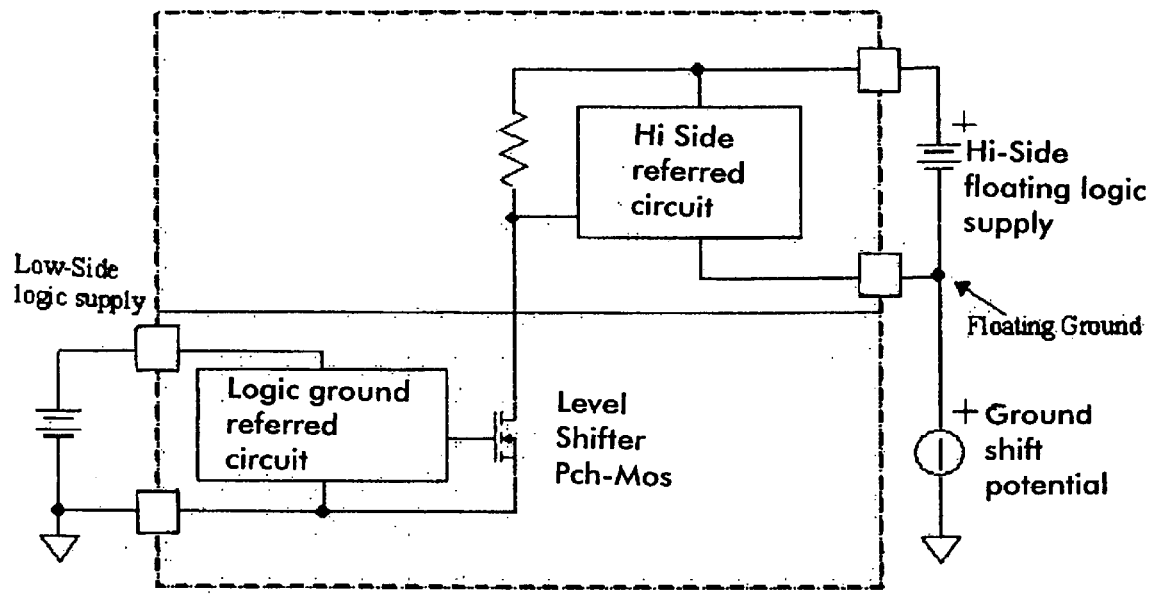
FIG. 1 is a circuit diagram of a prior art level shifting circuit to transmit signals from a low to high voltage circuit.
Figure 2:
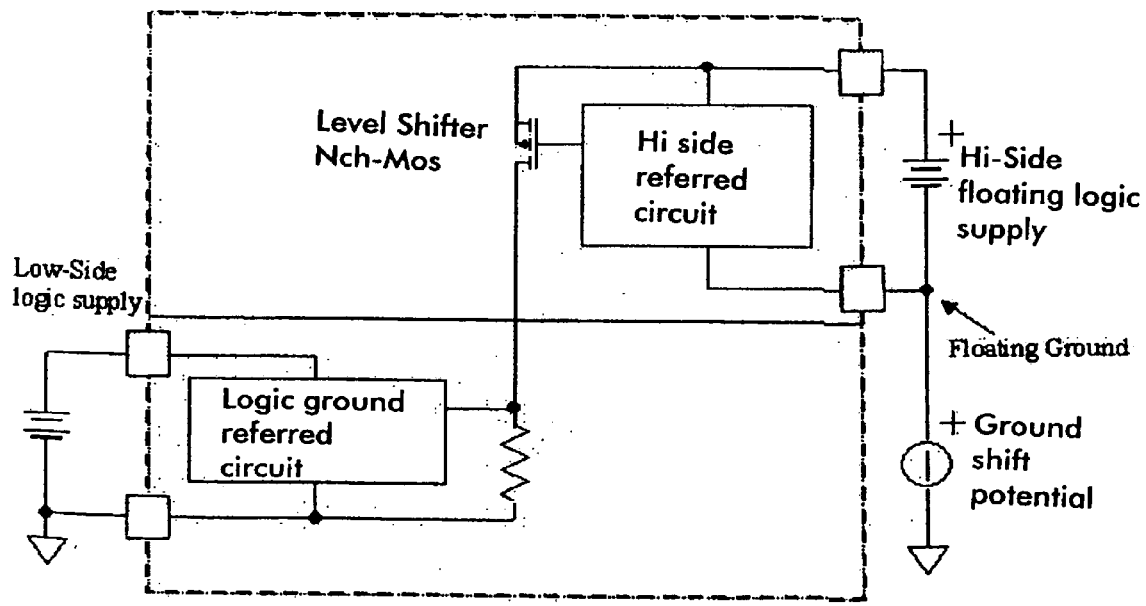
FIG. 2 is a circuit diagram of a prior art level shifting circuit for signals transmitted from a high to a low voltage circuit.
Figure 3:
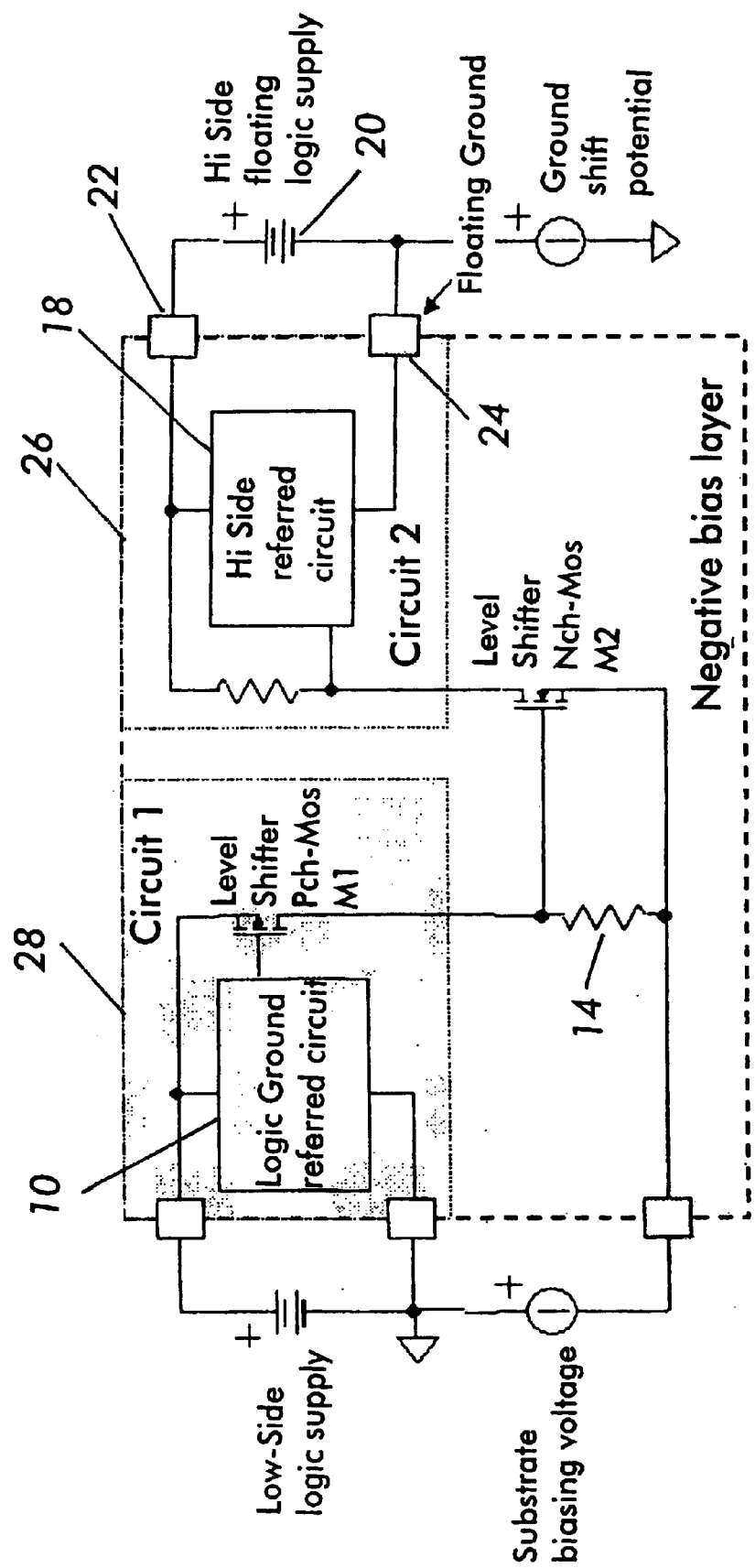
FIG. 3 is a circuit diagram of a translation and level shifting circuit for signals transmitted from a low to a high voltage circuit according to the present invention.
Figure 4:
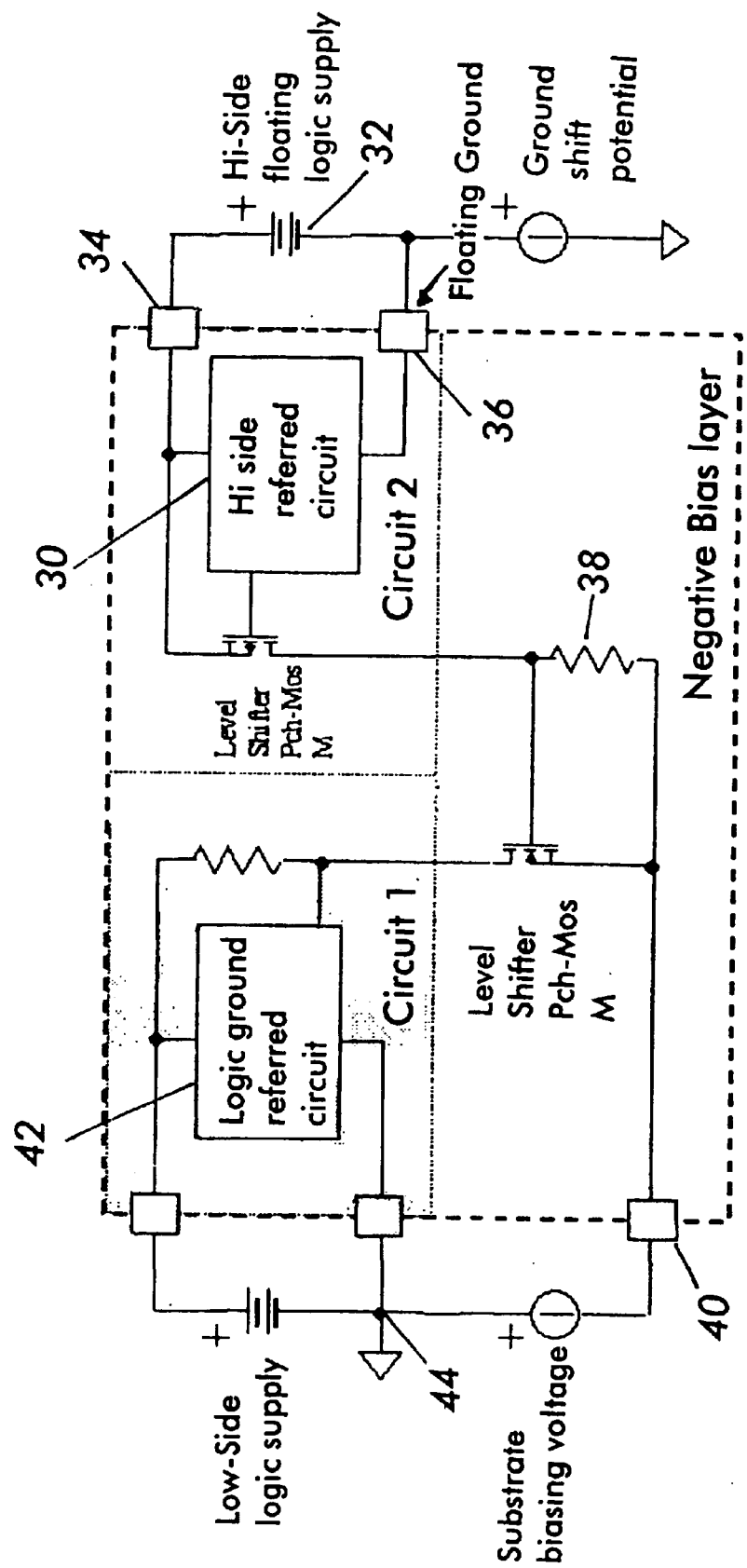
FIG. 4 is a circuit diagram of a translation and level shifting circuit for signals from a high to a low voltage circuit according to the present invention.

The basic concept of the invention is depicted in FIG. 3 and FIG. 4. The circuits shown permit signal transmission between two circuits whose reference voltage can swing in the range (−)Vbias to (Vswitch−Vbias) where Vswitch is the maximum voltage withstand of the high voltage MOSFETS and (−)Vbias is an external voltage, negative referring to the logic ground, typically of (−)50V or (−)100V.

Referring to FIG. 3, illustrating Low Side to High Side transfer from circuit 1 to circuit 2, the signal to be transferred is applied to a switch M1 (normally implemented as a P channel MOSFET) from an input logic circuit 10 that is referenced to a stable logic ground at a pin 12. Switch M1 sources current into a receiving device 14 (such as a resistor or a low voltage MOSFET in active load configuration). The receiving device 14 is referenced to the negative bias level by a biasing circuit which includes a substrate biasing source connected between pins 12 and 16. With the receiving device 14 and MOSFET M1 connected to the negative bias and low side logic supply 17 as illustrated, level shifting to a lower voltage reference is thus achieved. The signal across resistor 14 is then used to activate another switch M2 (normally implemented as an N channel MOSFET) that finally translates the information to the floating high side device 18 in circuit 2 of the IC referenced to a high side floating logic supply 20 at 600V or 1200V connected to pins 22 and 24.

The information cannot be transmitted continuously between circuit 1 and circuit 2 in FIG. 3 because of the excessive power dissipation during the on-state of MOSFET M2. In fact, though the drain current can be low, the high voltage present across M2 results in high power dissipation in the IC. This is normally avoided by means of a pulse transmission, and that conventional approach can be employed according to the present invention as well. That is, the information is transmitted though the structure from circuit 10 to circuit 18 as two pulses, turn on and turn off, and normally codified in the duty cycle of the resulting square wave.

It should be noted that the two circuits 10 and 18 as well as the two MOSFETs M1 and M2 do not need to be classified at the same isolation level. In particular, MOSFET M1 and all isolation rings around circuit 1 need lobe able to withstand only the substrate biasing voltage. If this voltage is 100V, for example, then a 200V silicon structure is enough for isolation purposes. On the other hand, MOSFET M2 and isolation rings around circuit 2 have to be high voltage structures, and have to withstand 600V or 1200V so that they normally occupy much more space in the silicon.

Summing up, in FIG. 3, the integration onto silicon requires two isolation structures, one, designated 26, for the high-side circuit 2 and the other, designated 28 for logic ground referenced circuit 1. While the area loss for the high side portion doesn't change from that of the state of the art, the isolation around circuit 1 and Pch MOS level shifter is added, with an attendant certain area of occupation. As described, however, these last high voltage structures are isolated at much lower voltage ratings, which means they are much smaller then those used in circuit 2 and the overall increase in area does not typically exceed 30%.

FIG. 4 shows the invention as applied to transmission from High Side circuit 2 to Low Side circuit 1. Here, the signal is transmitted from a high side referenced circuit 30, referenced to a high side floating logic supply 32 at pins 34 and 36 through a first level shifter MOSFET M3 a receiving device such as resistor 38 referenced to the negative bias level at a pin 40, and a second MOSFET M4 to a low side circuit 42 referenced to logic ground at a pin 42. It's the operation of FIG. 4 is similar to that of FIG. 3, but in this case MOSFET M3 and circuit 2 need to be created with high voltage isolation capability while MOSFET M4 and circuit 1 just need to withstand the negative biasing voltage.

A further pin is needed for the negative biasing on the IC package frame. This pin will be polarized at some tens volts difference (−50V or −100V usually) compared to the IC ground level. This usually requires attention to minimum clearances on the pin out design of the package, similar to, but less restrictive than used for the high side portion of the device.

In the field of electric motor drives the most used architecture for the power stage is a 3-phase Voltage Source Inverter ("VSI"). The VSI structure is used to convert a DC input voltage to an AC output, which lets the user control voltage and frequency of the three-phase voltage applied to the motor thus varying torque and speed. The same type of schematic, often in H bridge configuration, is used in UPS circuits and in Power Supply circuits in general and the invention here described is generally applicable.

Figure 5:
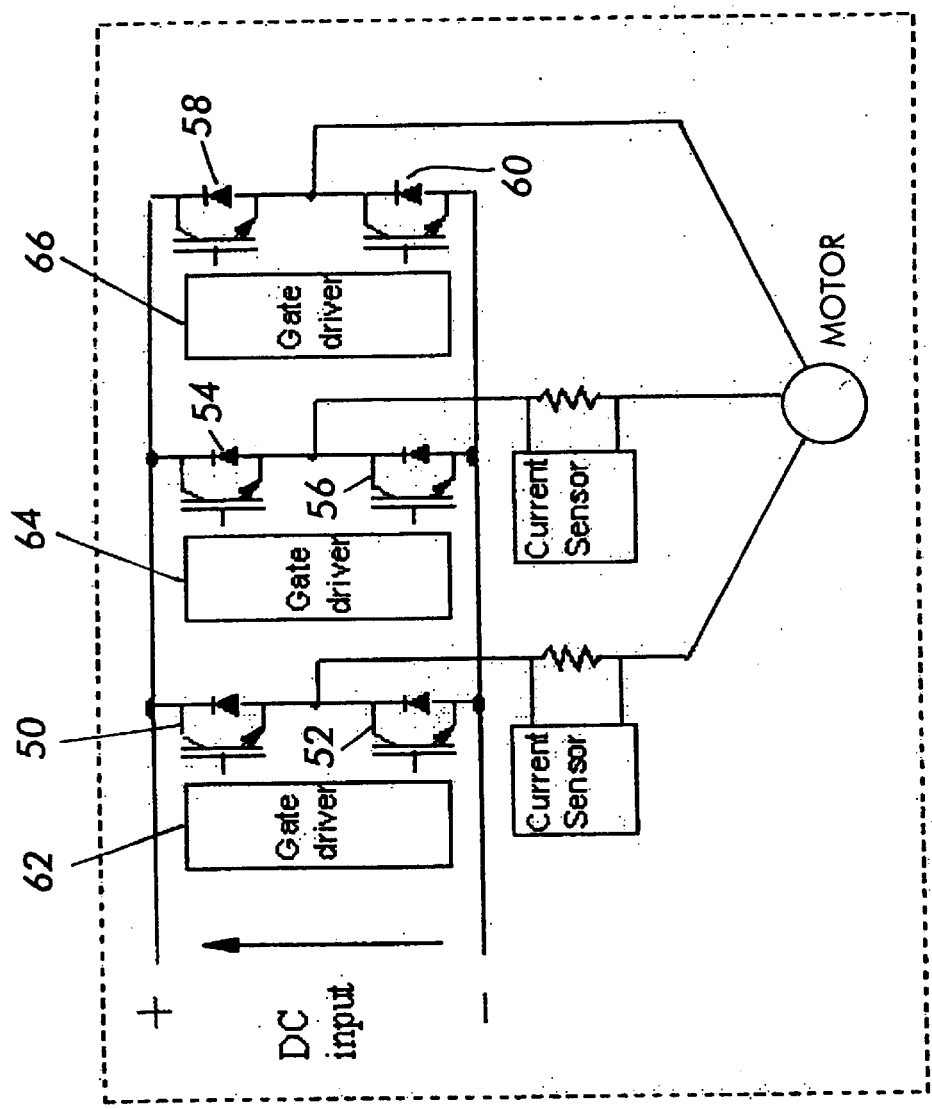
FIG. 5 is a schematic diagram of a typical inverter drive for a motor.

A three-phase inverter is made of 6 static switches (IGBTs or MOSFETs typically) as shown in FIG. 5. The architecture is conventional, and includes high side switches 05, 54. And 58, low side switches 52, 56, and 60, and gate drivers 62, 64, and 66.

1. The Gate Drivers

The static switches 50–60 of FIG. 5 need to be driven by a voltage applied to the gate-emitter terminals of each switch, according to the modulation strategy used in the application. The emitters of all high side switches 50, 54, and 58 are connected to the output phase so that for each phase, a floating gate-driver is needed that follows the variation of the output voltage and continues to apply the gate-emitter voltage, on and off, according to the PWM sequence. Also the low-side emitter voltage changes considerably across the DC bus minus voltage during normal system operation, because of the presence of parasitic elements on the power connections, in particular resistive and inductive effects, that cause the low side emitter voltage swing.

In applications involving more than 1 kilowatt of power, these voltage swings due to the parasitic elements present in the system layout are not negligible; their magnitude can easily reach and exceed the gate-emitter command voltage and heavily affect the overall functionality and life to the application. This effect is even worse in short circuit situations, when the current flowing in the parasitic inductances is very high and the Lenz effect is strong. Accordingly, even the low-side gate-driver needs to be floating, though in a lower voltage range.

Taking an example from an industrial motor driver supplied at 550 Vdc and with 50 amp rated IGBTs, the emitter voltage of the high-side switch can vary in the range of −50V to +1000V during short circuit withstand. For the low-side emitters the voltage range could be from (−)50V to +100V depending on the value of parasitic parameters in the power path's layout. These values can be read when using, as a reference, the emitter of another IGBT in a leg not carrying the short circuit current.

Figure 6:
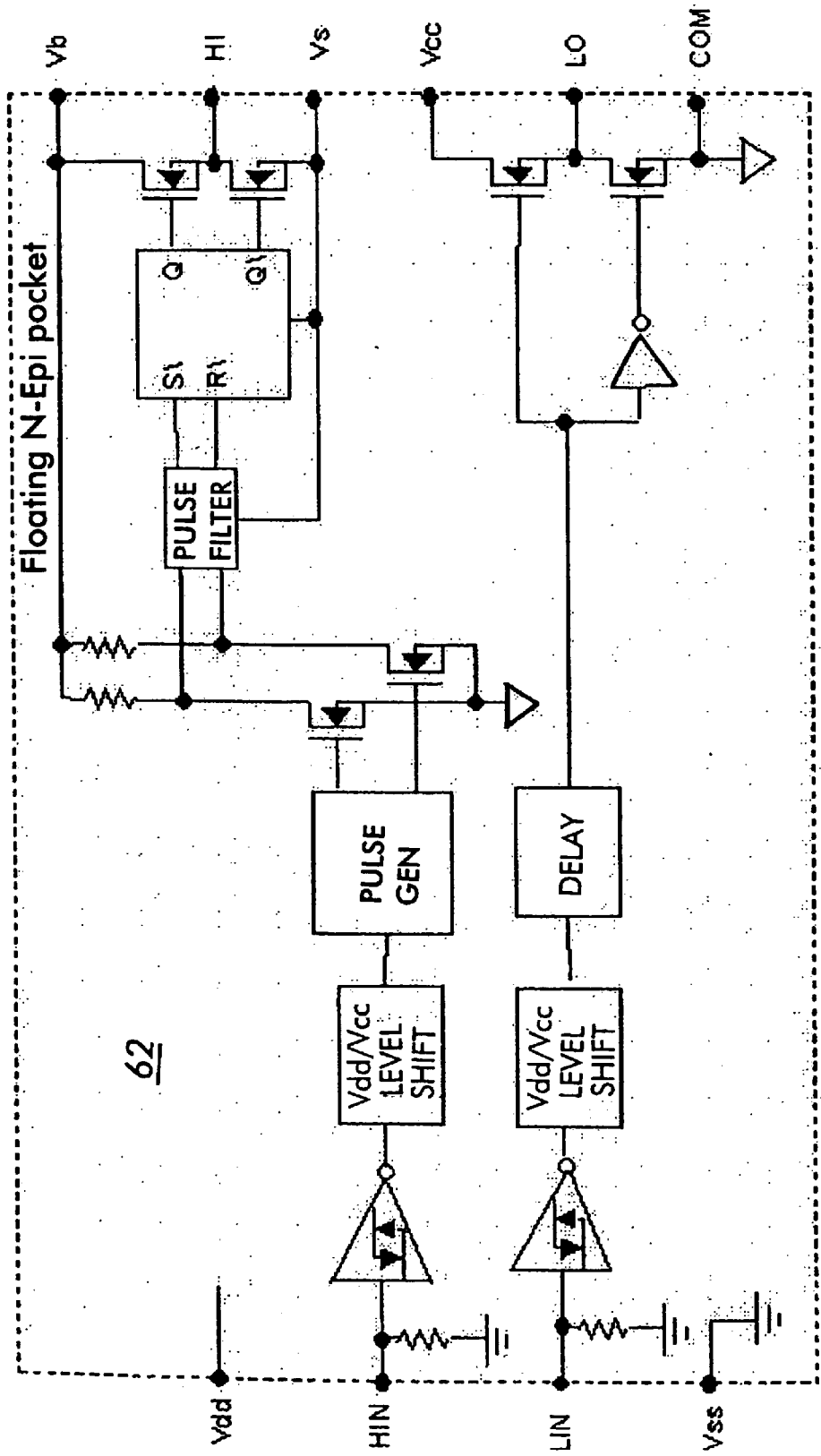
FIG. 6 is a circuit schematic of a conventional gate driver circuit.

FIG. 6 is a simplified block schematic of a typical integrated halfbridge gate-driver e.g. gate driver 62 of FIG. 5, showing on high-side and one low-side driver for one phase with a prior art type of transmission structure. The pin out definitions for FIG. 6 are:

| | |
|---|---|
| Vss: | logic ground |
| Vdd: | logic supply |
| HIN: | high-side input command |
| LIN: | low-side input command |
| COM: | low-side power ground |
| Vcc: | low-side driver supply |
| LO: | low-side driver output |
| Vs: | high-side driver floating ground |
| Vb: | high-side driver floating supply |
| HI: | high-side driver output |

Looking at the driver block schematic of FIG. 6, the following observations can be made:

When the voltage Vb is less than that of COM, the transmission of command from HIN to HI becomes impossible;

When the voltage level of COM becomes higher than that of Vdd the transmission from LIN to LO becomes impossible;

When Vb, which is also the N-Epi floating pocket potential, is less than the substrate voltage (either COM or Vss, depending on the IC layout), either the "Substrate-floating-Epi" diode goes into direct conduction and latch up or general failure may occur in the IC structure.

The present invention permits the correct information transmission from control circuit to IGBTs when the relative emitter voltage is negative, increasing the reliability of transmission, in particular during short circuit withstands, and completely avoids latch up problems.

Figure 7:
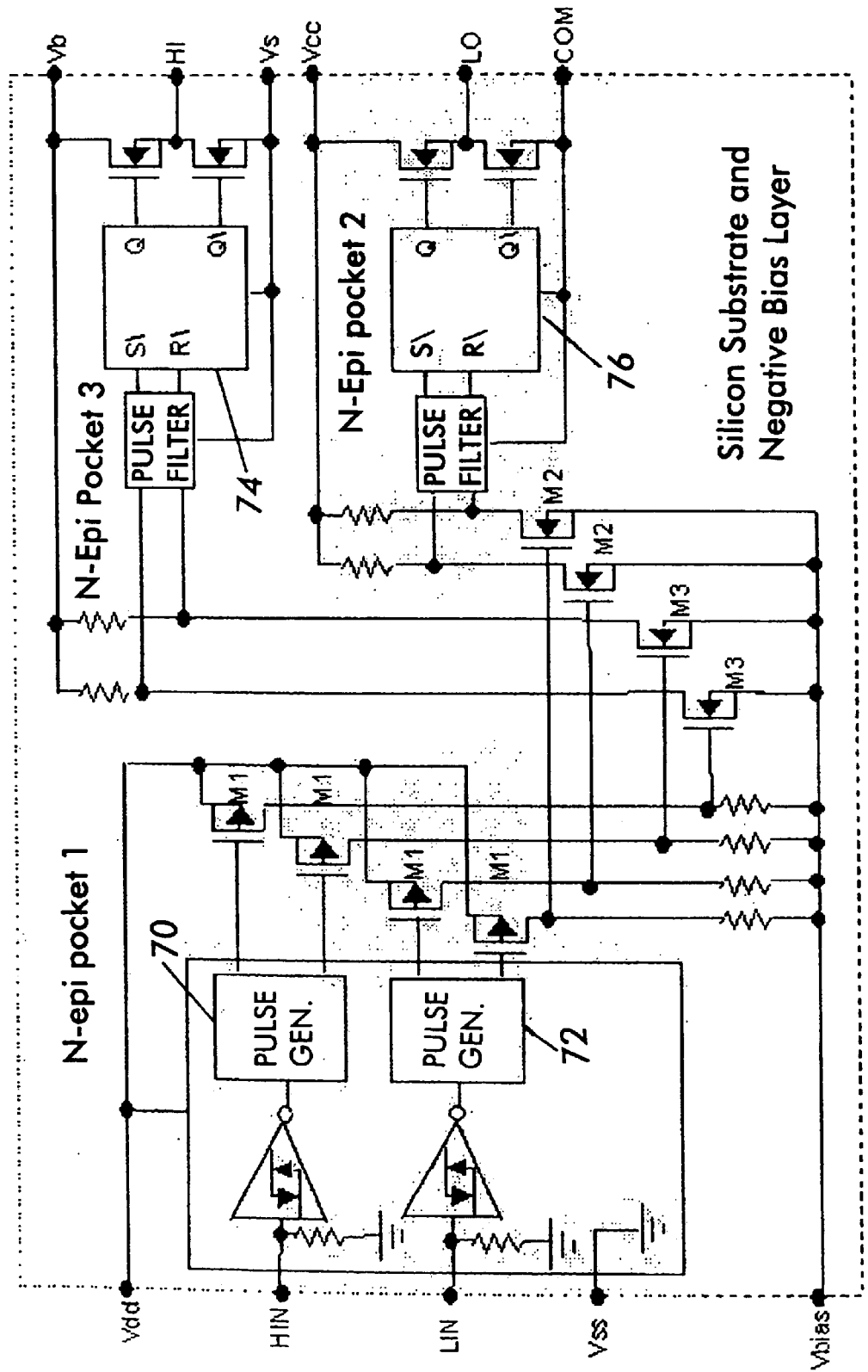
FIG. 7 is a circuit schematic of a gate driver circuit according to the present invention.

FIG. 7 is an example of a gate-driver using the present invention. The Pin Out Definitions for FIG. 7 are:

| | |
|---|---|
| Vss: | logic ground |
| Vdd: | logic supply |
| HIN: | high-side input command |
| LIN: | low-side input command |
| COM: | low-side power ground |
| Vcc: | low-side driver supply |
| LO: | low-side driver output |
| Vs: | high-side driver floating ground |
| Vb: | high-side driver floating supply |
| HI: | high-side driver output |
| Vbias: | Negative bias voltage input |

In the IC shown in FIG. 7, three separated epi-pockets 1–3 are indicated (using different shading) to illustrate the different isolation voltage structures possible. The driver shown in FIG. 7 includes separate high and low side pulse generators 70 and 72 referenced to the Vbias voltage, each having complementary outputs which are connected respectively to set and reset inputs of output circuits 74 and 76. The outputs of pulse generators 70 and 72 are connected to the output circuits through separate level shift circuits which are the same in architecture and function as the circuit shown in FIG. 3.

N-Epi Pocket 1 (which encloses pulse generators 70 and 72, and four MOSFETs M1) and N-Epi Pocket 2 (which encloses output circuit 76 and associated MOSFETS M2) have to withstand only the Vbias voltage. These pockets are realized in the silicon using high voltage isolation rings adequate for this purpose; normally 100V or 200V are enough. Also all level shifting MOSFETs M1 and M2 have the same BVDss.

The N-Epi pocket 3 (which encloses output circuit 74) is the very high voltage side of the driver and is normally isolated at 600V or 1200V. In this case, the structure for MOSFETs M3 are at the same voltage of 600V or 1200V.

A further supply and a dedicated pin for the Vbias voltage is provided. The Vbias pin is polarized much lower than both Vss and COM voltage levels. The magnitude of this negative Vbias voltage will then be the immunity margin for the correct functioning of the IC when the system shows underground voltage swings.

2. The Current-Sense Devices.

The same problem previously described arises during current sensing in the output phases of the inverter. The high-side part of the circuit is connected to the output phase and senses the motor phase current measuring the drop across an external shunt resistor. The information is then transformed in a burst of variable length pulses or a square wave with variable duty cycle, and translated to the low-side part of the IC in order to be processed and then provided to an external processor. Using the present invention, the pulse to transmit can be distorted or even canceled if the ground shift potential becomes negative during the transmission interval, resulting in a high error rate for the related codified information.

Figure 8:
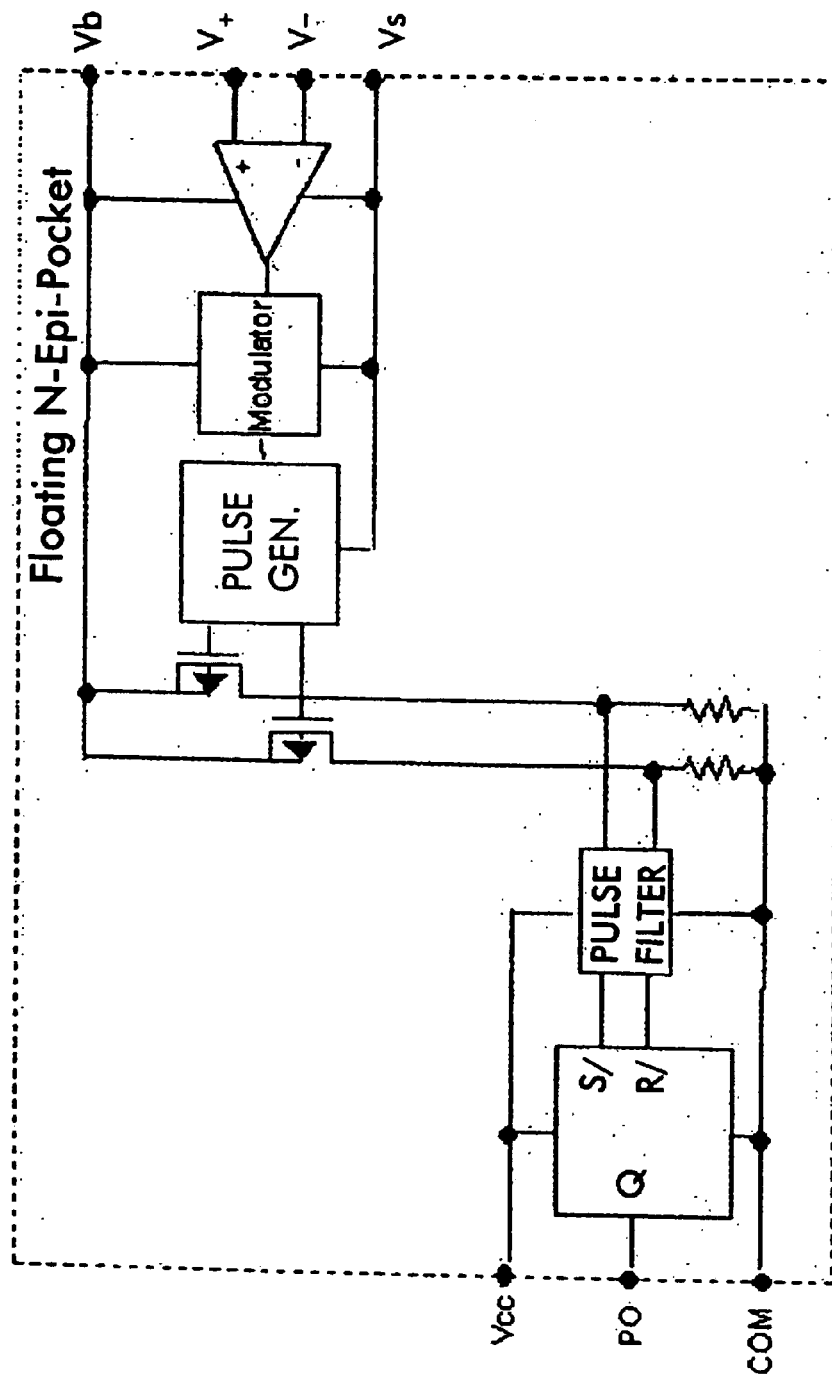
FIG. 8 is a circuit schematic of a conventional current sensing circuit.

FIG. 8 shows an example of an integrated current sense device with a prior art transmission structure.

Figure 9:
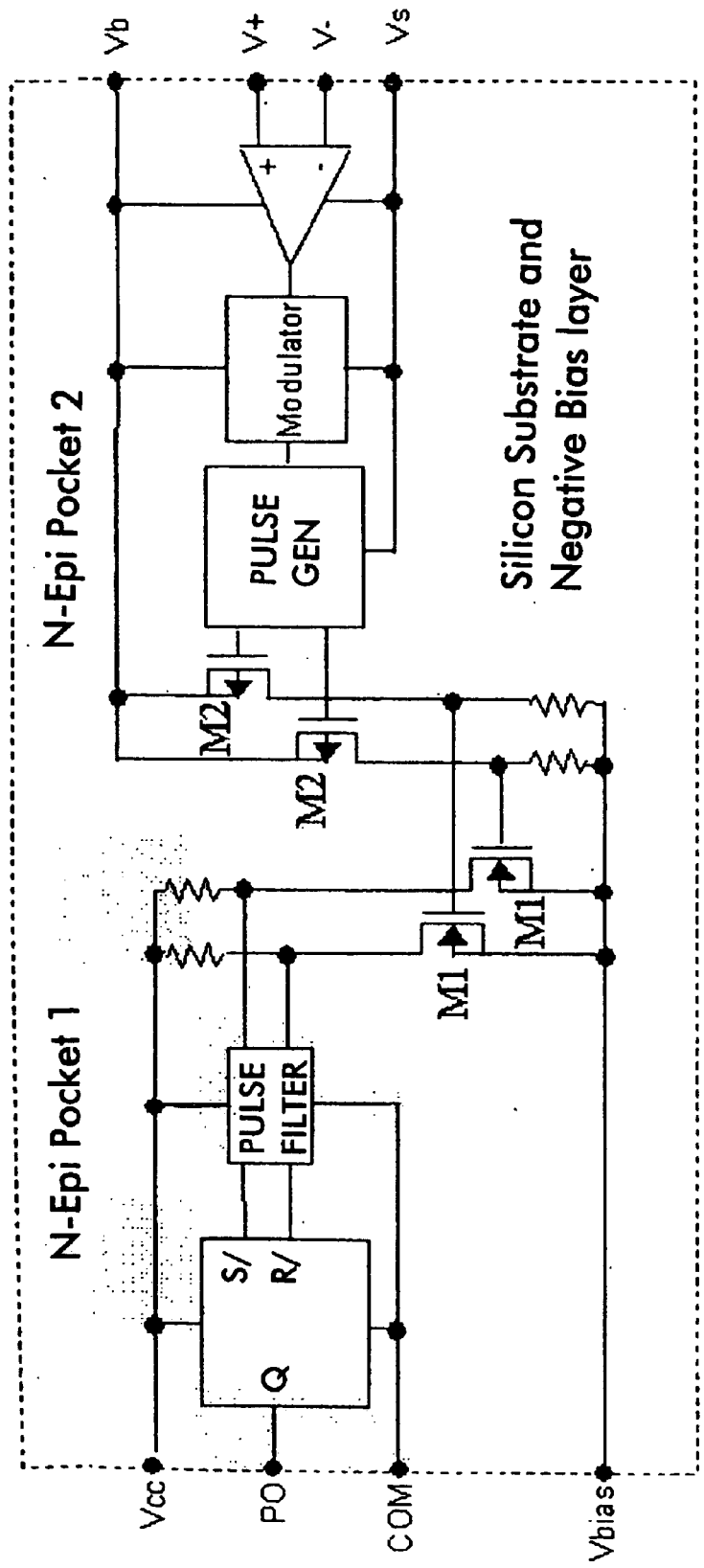
FIG. 9 is a circuit schematic of a current sensing circuit according to the present invention.

Problems related to the loss of information previously described disappear when using the solution proposed by this invention. A simplified block schematic using the invention in a current sense application is shown in FIG. 9. As this provides signal transmission from a high level to a low level, it will be appreciated that the level shifting architecture and function correspond to that of FIG. 4. Level shifting MOSFET M1 is rated at a much lower isolation voltage than M2. This solution does not increase excessively the transmission delay between the two puts of the IC and the reduction effect on the transmission throughput is negligible.

In FIG. 9, the two N-Epi pockets 1 and 2 at different levels of isolation are shown in different shading. N-Epi 1 and FET M1 can be isolated at 100V or 200V while N-Epi 2 and Fet M2 are the very high voltage isolation structures.

A new idea to solve the common problem of under-ground voltage swings in integrated circuits used in industrial applications has been presented. This new idea not only solves problems related to loss of communication when under-ground swings occur, but also overcomes problems created by the intrinsic nature of the ICs having a substrate that can cause IC latch-up when one of the N-Epi wells, normally in inverse polarization, occasionally goes into direct conduction.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A device operable to transfer an input signal between differently referenced circuits, comprising:

an input circuit referenced to a first voltage reference and operable to provide the input signal;

a receiving device coupled to receive the input signal from the input circuit;

a biasing circuit coupled to the receiving device to provide a biasing voltage reference for the receiving device;

a first level shifter coupled to the input circuit and the receiving device for translating the input signal so it is referenced to the bias voltage;

an output circuit referenced to a second voltage reference; and a second level shifter coupled to receive the translated input signal and to provide the translated input signal to the output circuit, whereby an output signal is provided which is related to the input signal and referenced to the second voltage reference.

2. A device according to claim 1, wherein the first reference voltage is a stable logic ground, and the second reference voltage is a floating ground.

3. A device according to claim 1, wherein the first reference voltage is a floating ground, and the second reference voltage is a stable logic ground.

4. A device according to claim 1, wherein the input and output circuits are adapted to operate at voltages which are substantially different in magnitude.

5. A device according to claim 1, wherein the device is implemented in an integrated circuit, and further includes:
a first voltage isolation structure around the input circuit capable of withstanding a voltage level which exceeds the operating voltage of the input circuit; and
a second voltage isolation structure around the output circuit capable of withstanding a voltage level which exceeds the operating voltage of the output circuit.

6. A device according to claim 4, wherein the magnitude of the isolation voltage level for the input circuit is lower than the magnitude of the isolation voltage level for the output circuit.

7. A device according to claim 6, wherein the first reference voltage is a stable logic ground, the second reference voltage is a floating ground, and the bias voltage in negative relative to the stable ground.

8. A device according to claim 5, wherein the first reference voltage is a floating ground, the second reference voltage is a stable logic ground, and the bias voltage is negative relative to the stable ground.

9. A device according to claim 1 wherein the input circuit is operative to convert a current sense signal level to a pulse interval signal.

10. A device operable to transfer input signals between differently referenced circuits, comprising:
an input circuit referenced to a first voltage reference and operable to provide at least one input signal;
respective receiving devices coupled to receive each input signal from the input circuit;
a biasing circuit coupled to the receiving devices to provide a biasing voltage reference for the receiving devices;
respective first level shifters coupled to the input circuit and the receiving devices for translating the input signals so they are referenced to the bias voltage;
one or more output circuits referenced to a respective voltage reference for each input signal; and
respective second level shifters coupled to receive the translated input signals and to provide the translated input signals to the respective output circuits,
whereby output signals are provided which are related to the input signals and referenced to the respective second voltage references.

11. A device according to claim 10, wherein the reference voltage for the input circuit is a stable logic ground, and the output circuit voltage references are floating grounds.

12. A device according to claim 10, wherein the input and output circuits are adapted to operate at voltages which are substantially different in magnitude.

13. A device according to claim 10, wherein the device is implemented in an integrated circuit having a substrate, and the biasing circuit is coupled to the first voltage reference and the substrate to bias the substrate relative to the first voltage reference.

14. A device according to claim 13, wherein the biasing circuit produces a negative voltage bias on the substrate with respect to the first voltage reference.

15. A device according to claim 12, further including:
a first voltage isolation structure around the input circuit capable of withstanding a voltage level which exceeds the input stage operating voltage; and
respective voltage isolation structures around each of the output circuits capable of withstanding voltage level which exceeds the operating voltages of the respective output circuits.

16. A device according to claim 15, wherein the magnitude of isolation voltage for the input circuit is lower than the magnitude of the isolation voltage for at least one of the output circuits.

17. A device according to claim 16, wherein the reference voltage in the input circuit is a stable logic ground; the reference voltages for the output circuits are floating grounds; and the bias voltage is negative relative to the stable ground.

18. A device according to claim 10, further comprising a pulse generator in the input stage and coupled to the input signal,
the pulse generator being operative to output pulses to the level shifting circuit with a pulse duration related to a value of the input signal.

19. A device according to claim 10, including first and second output stages which are low and high drivers for a half bridge switching circuit.

20. A method for transferring an input signal from an input circuit referenced to a first voltage reference to an output circuit referenced to a second voltage reference, the method comprising the steps of:
providing a receiving device biased to a voltage below the first voltage reference;
coupling the input circuit through a first level shifter to the receiving device so that the input signal becomes referenced to the bias voltage reference;
transferring the input signal from the receiving device through a second level shifter to the output circuit whereby the transferred signal is referenced to the second voltage reference level; and
outputting the signal from the output circuit.

21. A method according to claim 20, further comprising isolating the input and output circuits from voltage levels exceeding respective operating voltages for the input and output circuits.

22. The method according to claim 21, further comprising codifying the input signal as an interval between pulses transferred between the input circuit and the output circuit.

23. The method according to claim 20, wherein the voltage biasing the receiving device is lower than the first or second voltage reference levels.

* * * * *